(12) United States Patent
Ejima et al.

(10) Patent No.: US 7,188,298 B2
(45) Date of Patent: Mar. 6, 2007

(54) ERROR CORRECTION ENCODING AND DECODING METHODS AND APPARATUSES FOR DVI AUDIO DATA

(75) Inventors: Naoki Ejima, Hirakata (JP); Toshiroh Nishio, Hirakata (JP); Akihisa Kawamura, Hirakata (JP); Hidekazu Suzuki, Yamatokoriyama (JP); Hiroshige Okamoto, Kanagawa (JP); Tetsuya Hiroe, Kanagawa (JP); Sho Murakoshi, Tokyo (JP)

(73) Assignees: Matsushita Electric Industrial Co., Ltd., Osaka (JP); Sony Corporation, Tokyo (JP)

( * ) Notice: Subject to any disclaimer, the term of this patent is extended or adjusted under 35 U.S.C. 154(b) by 215 days.

(21) Appl. No.: 10/471,019

(22) PCT Filed: Mar. 14, 2002

(86) PCT No.: PCT/JP02/02403

§ 371 (c)(1),
(2), (4) Date: Sep. 8, 2003

(87) PCT Pub. No.: WO02/073812

PCT Pub. Date: Sep. 19, 2002

(65) Prior Publication Data

US 2004/0153933 A1 Aug. 5, 2004

(30) Foreign Application Priority Data

Mar. 14, 2001 (JP) .............................. 2001-72949

(51) Int. Cl.
*H03M 13/27* (2006.01)

(52) U.S. Cl. .................................................. 714/762
(58) Field of Classification Search ................ 714/751, 714/762, 701, 726
See application file for complete search history.

(56) References Cited

U.S. PATENT DOCUMENTS

| | | | | | |
|---|---|---|---|---|---|
| 4,206,440 | A | * | 6/1980 | Doi et al. | .................... 714/758 |
| 4,413,251 | A | * | 11/1983 | Adler et al. | ................... 341/59 |
| 4,608,456 | A | * | 8/1986 | Paik et al. | .................... 380/28 |
| 4,852,102 | A | | 7/1989 | Yamaguchi | |
| 5,070,503 | A | * | 12/1991 | Shikakura | .................... 714/776 |

(Continued)

FOREIGN PATENT DOCUMENTS

JP     7-283740     10/1995

(Continued)

OTHER PUBLICATIONS

Digital Display Working Group, Digital Visual Interface DVI, Revision 1.0, Apr. 2, 1999, pp. 1-76.

*Primary Examiner*—Stephen M. Baker
(74) *Attorney, Agent, or Firm*—Wenderoth, Lind & Ponack, L.L.P.

(57) ABSTRACT

An error-correction coding method and an error-correction decoding method utilize error detection and error correction for an audio signal when a video signal and the audio signal are multiplexed and transmitted by a DVI. After an error correction code is added to each sample (sample data unit) of the digital audio signal, n continuous (n: integer equal to or larger than 2) pieces of the samples (sample data units) of the digital audio signal, to which error correction codes are added, are interleaved to generate a coded audio signal.

5 Claims, 8 Drawing Sheets

U.S. PATENT DOCUMENTS

| | | | |
|---|---|---|---|
| 5,257,271 A * | 10/1993 | Lagadec et al. | 714/755 |
| 5,561,468 A * | 10/1996 | Bryan et al. | 348/469 |
| 5,832,024 A | 11/1998 | Schotz et al. | |
| 6,048,730 A * | 4/2000 | Waldron | 435/468 |
| 6,621,527 B1 * | 9/2003 | Limberg et al. | 348/725 |
| 6,903,780 B2 * | 6/2005 | Mair et al. | 348/469 |
| 2003/0048852 A1 * | 3/2003 | Hwang et al. | 375/240.26 |
| 2003/0112828 A1 * | 6/2003 | Nio et al. | 370/521 |
| 2003/0147005 A1 * | 8/2003 | Okamoto et al. | 348/473 |

FOREIGN PATENT DOCUMENTS

| | | |
|---|---|---|
| JP | 2000-165258 | 6/2000 |
| JP | 2000-187948 | 7/2000 |
| WO | 99/19839 | 4/1999 |

* cited by examiner

ERROR CORRECTION ENCODING AND DECODING METHODS AND APPARATUSES FOR DVI AUDIO DATA

TECHNICAL FIELD

The present invention relates to an error-correction coding method and apparatus for performing error-correction coding in which error correction codes to be used for correcting transmission errors at a receiving end are added to a digital audio signal to be transmitted, when transmitting a digital video signal and the digital audio signal between a transmitting end and the receiving end through a digital interface means. Further, the invention relates to a error-correction decoding method and apparatus for performing, at the receiving end, error-correction decoding for the signal that has been coded by the error-correction coding method and apparatus and then transmitted.

BACKGROUND ART

Conventionally, for example, when transmitting a video signal to a liquid crystal monitor or a CRT, analog transmission using an analog RGB interface has been in the mainstream. However, the number of displayable pixels has previously been determined in the liquid crystal monitor, and digital transmission has received attention with proliferation of the liquid crystal monitor. Further, an increase in refresh rate is needed for a reduction in flicker, and high-speed data transmission is needed for image display on a wider screen. Since, in the conventional analog transmission, transmission distortion is considerable and ghosts are likely to occur, importance of digital transmission is increasing with improvement in image quality.

With the needs for digital transmission, in recent years, DVI (Digital Visual Interface) has received attention. The DVI is an interface for digital display connection which is defined by DDWG (Digital Display Working Group), and transfers data using plural data channels on the basis of TMDS (Transition Minimized Differential Signaling) technique. When adopting a digital transmission method using the DVI, high-quality video data with less transmission distortion can be provided by digital transmission at low cost.

As described above, by the adoption of the DVI, a higher-quality image can be obtained as compared with analog transmission. Further, in the DVI, there exists a blanking period when other data can be transmitted, besides a period for transmitting RGB (Red, Green, Blue) pixel data. It is possible to transmit, for example, an audio signal using this blanking period.

When transmitting a digital video signal, a transmission error such as bit corruption sometimes occurs. However, even when such transmission error occurs in transmitting a video signal, it is not very conspicuous on screen and, therefore, no serious problem occurs. However, when a transmission error occurs during transmission of an audio signal, noise or unusual sound might occur and, therefore, the error rate must be considered more strictly than in the case of transmitting a video signal. That is, when transmitting error-conspicuous data other than a video signal by using the blanking period of the DVI or the like, processing for error detection and error correction is required independently. However, in the standard of the interface for digital display connection which is defined by the DDWG (Digital Display Working Group), a construction for error detection and error correction for an audio signal has not been proposed.

The present invention is made to solve the above-described technical problems and has for its object to provide an error-correction coding method, an error-correction coding apparatus, an error-correction decoding method, and an error-correction decoding apparatus, which can perform error detection and error correction for an audio signal when transmitting multiplexed video signal and audio signal by a DVI.

SUMMARY OF THE INVENION

According to a first aspect of the present invention, there is provided an error-correction coding method for performing coding in which an error correction code to be used for correcting a transmission error at a receiving end is added to a digital audio signal to be transmitted, when transmitting a digital video signal and the digital audio signal between a transmitting end and the receiving end through a digital interface means, and the method includes: an error correction code addition step of adding an error correction code to each of samples (sample data units) of the digital audio signal; and an interleaving step of interleaving n continuous (n: integer equal to or larger than 2) pieces of samples (sample data units) of the digital audio signal to which error correction codes are added in the error correction code addition step, thereby to generate a coded audio signal.

Therefore, it is possible to realize a system which effectively performs error detection and error correction for an audio signal, when a video signal and the audio signal are multiplexed and transmitted by a DVI.

According to a second aspect of the present invention, in the error-correction coding method defined in the first aspect, the digital interface means converts every two continuous bits of the coded audio signal generated in the interleaving step into a signal of ten continuous bits, and transmits the converted signals.

Therefore, it is possible to realize a system which effectively performs error detection and error correction for an audio signal, when a video signal and the audio signal are multiplexed and transmitted by a DVI.

According to a third aspect of the present invention, in the error-correction coding method defined in the second aspect wherein, in the interleaving step, continuous two samples (sample data units) of the digital audio signal, to which error correction codes are added, are interleaved to generate a coded audio signal.

Therefore, it is possible to realize a system which effectively performs error detection and error correction for an audio signal, when a video signal and the audio signal are multiplexed and transmitted by a DVI.

According to a fourth aspect of the present invention, in the error-correction coding method defined in the first aspect, the digital interface means converts every four continuous bits of the coded audio signal generated in the interleaving step into a signal of ten continuous bits, and transmits the converted signals.

Therefore, it is possible to realize a system which effectively performs error detection and error correction for an audio signal, when a video signal and the audio signal are multiplexed and transmitted by a DVI.

According to a fifth aspect of the present invention, in the error-correction coding method defined in the fourth aspect, in the interleaving step, four continuous samples (sample data units) of the digital audio signal, to which error correction codes are added, are interleaved to generate a coded audio signal.

Therefore, it is possible to realize a system which effectively performs error detection and error correction for an audio signal, when a video signal and the audio signal are multiplexed and transmitted by a DVI.

According to a sixth aspect of the present invention, there is provided an error-correction decoding method for performing, at a receiving end, error-correction decoding for a signal which has been coded and transmitted by the error-correction coding method defined in the first aspect, when transmitting a digital video signal and a digital audio signal between a transmitting end and the receiving end through a digital interface means, and the method includes: a deinterleaving step of deinterleaving a sequence of continuous bits of the coded audio signal generated by the error-correction coding method, sequentially bit by bit, into n (n: integer equal to or larger than 2) samples (sample data units) of the digital audio signal; and an error correction step of performing error detection and error correction for each of the samples (sample data unit) of the digital audio signal which have been obtained in the deinterleaving step.

Therefore, it is possible to realize a system which effectively performs error detection and error correction for an audio signal, when a video signal and the audio signal are multiplexed and transmitted by a DVI.

According to a seventh aspect of the present invention, in the error-correction decoding method defined in the sixth aspect, at the transmitting end, the digital interface means converts every continuous two bits of the digital audio signal which has been coded by the error-correction coding method defined in the first aspect into a signal of ten continuous bits and then transmits the signal; and at the receiving end, the digital interface means converts every ten bits of the coded digital audio signal which has been converted for every two bits into a signal of ten bits, into the original signal comprising two continuous bits.

Therefore, it is possible to realize a system which effectively performs error detection and error correction for an audio signal, when a video signal and the audio signal are multiplexed and transmitted by a DVI.

According to an eighth aspect of the present invention, in the error-correction decoding method defined in the seventh aspect, in the deinterleaving step, a sequence of continuous bits of the coded audio signal which has been generated by the error-correction coding method defined in the first aspect is sequentially deinterleaved, bit by bit, into two samples (sample data units) of the digital audio signal.

Therefore, it is possible to realize a system which effectively performs error detection and error correction for an audio signal, when a video signal and the audio signal are multiplexed and transmitted by a DVI.

According to a ninth aspect of the present invention, in the error-correction decoding method defined in the eighth aspect, in the error correction step, when performing error detection and error correction for each of the two samples (sample data units) of the digital audio signal which are generated in the deinterleaving step, if the error detection and error correction have been performed for one of the two samples (sample data units) while an error is detected but the error position cannot be specified for the other sample (sample data unit), a bit in a position of the other sample (sample data unit) corresponding to the error position specified for the one sample (sample data unit) is inverted and, thereafter, the other sample (sample data unit) with the inverted bit is again subjected to error detection and error correction.

Therefore, it is possible to realize a system which effectively performs error detection and error correction for an audio signal, when a video signal and the audio signal are multiplexed and transmitted by a DVI.

According to a tenth aspect of the present invention, in the error-correction decoding method defined in the sixth aspect, at the transmitting end, the digital interface means converts every four continuous bits of the digital audio signal which has been coded by the error-correction coding method defined in the first aspect into a signal of ten continuous bits and then transmits the signal; and at the receiving end, the digital interface means converts every ten bits of the coded digital audio signal which has been converted for every four bits into a signal of ten bits, into the original signal comprising four continuous bits.

Therefore, it is possible to realize a system which effectively performs error detection and error correction for an audio signal, when a video signal and the audio signal are multiplexed and transmitted by a DVI.

According to an eleventh aspect of the present invention, in the error-correction decoding method defined in the tenth aspect, in the deinterleaving step, a sequence of continuous bits of the coded audio signal which has been generated by the error-correction coding method defined in the first aspect is sequentially deinterleaved, bit by bit, into four samples (sample data units) of the digital audio signal.

Therefore, it is possible to realize a system which effectively performs error detection and error correction for an audio signal, when a video signal and the audio signal are multiplexed and transmitted by a DVI.

According to a twelfth aspect of the present invention, in the error-correction decoding method defined in the eleventh aspect, in the error correction step, when performing error detection and error correction for each of the four samples (sample data units) of the digital audio signal which are generated in the deinterleaving step, if the error detection and error correction have been performed for one of the four samples (sample data units) while an error is detected but the error position cannot be specified for another sample (sample data unit), a bit in a position of the other sample (sample data unit) corresponding to the error position specified for the one sample (sample data unit) is inverted and, thereafter, the other sample (sample data unit) with the inverted bit is again subjected to error detection and error correction.

Therefore, it is possible to realize a system which effectively performs error detection and error correction for an audio signal, when a video signal and the audio signal are multiplexed and transmitted by a DVI.

According to a thirteenth aspect of the present invention, there is provided an error-correction coding apparatus for performing coding in which an error correction code to be used for correcting a transmission error at a receiving end is added to a digital audio signal to be transmitted, when transmitting a digital video signal and the digital audio signal between a transmitting end and the receiving end through a digital interface means, and the apparatus includes: an error correction code addition means for adding an error correction code to each of samples (sample data units) of the digital audio signal; and an interleaving means for interleaving n continuous (n: integer equal to or larger than 2) pieces of samples (sample data units) of the digital audio signal to which error correction codes are added by the error correction code addition means, thereby to generate a coded audio signal.

Therefore, it is possible to provide an error-correction coding apparatus which realizes a system that effectively performs error detection and error correction for an audio signal, when a video signal and the audio signal are multiplexed and transmitted by a DVI.

According to a fourteenth aspect of the present invention, there is provided an error-correction decoding apparatus for performing, at a receiving end, error-correction decoding for a signal which has been coded and transmitted by the error-correction coding apparatus defined in the first aspect, when transmitting a digital video signal and a digital audio signal between a transmitting end and the receiving end through a digital interface means, and the apparatus includes: a deinterleaving means for deinterleaving a sequence of continuous bits of the coded audio signal generated by the error-correction coding apparatus, sequentially bit by bit, into n (n: integer equal to or larger than 2) samples (sample data units) of the digital audio signal; and an error correction means for performing error detection and error correction for each of the samples (sample data units) of the digital audio signal which have been obtained by the deinterleaving means.

Therefore, it is possible to provide an error-correction decoding apparatus which realizes a system that effectively performs error detection and error correction for an audio signal, when a video signal and the audio signal are multiplexed and transmitted by a DVI.

BRIEF DESCRIPTION OF THE DRAWINGS

FIG. 4(*b*) is a diagram illustrating samples (sample data units) of a coded audio signal to which error correction codes are added.

DETAILED DESCRIPTION OF THE INVENTION

Hereinafter, an embodiment of the present invention will be described with reference to the drawings. A description will be given of an example where the embodiment of the present invention is applied to a case where a digital video signal and a digital audio signal are transmitted between a transmitting end and a receiving end through a digital interface means that is in conformity with the standard of the interface for digital display connection which is defined by the DDWG (Digital Display Working Group). In the standard of the interface for digital display connection defined by the DDWG (Digital Display Working Group), for the purpose of preventing a signal traveling through a transmission path from becoming a DC-like signal in which DC components are biased, there is employed a transmission method in which, at the transmitting end, a digital video signal is subjected to 8-10 conversion for converting every 8 bits of the signal into a 10-bit signal while a digital audio signal is subjected to 2-10 conversion for converting every 2 bits of the signal into a 10-bit signal, and the converted signals are output to the transmission path; and at the receiving end, 10-8 conversion and 10-2 conversion are carried out to obtain the original digital video signal and digital audio signal, respectively.

Figure 1:
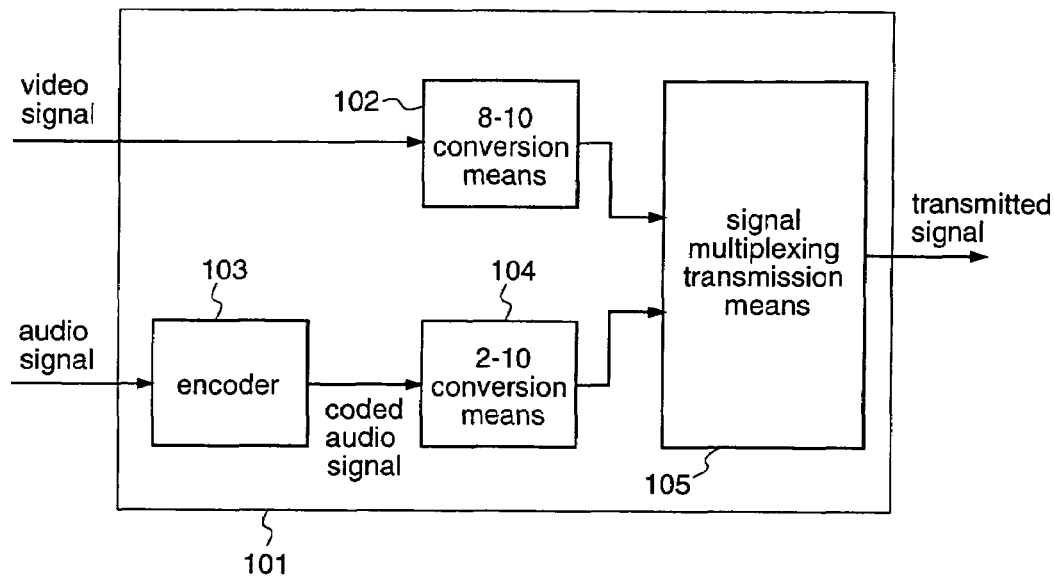
FIG. 1 is a block diagram illustrating the construction of a digital signal transmission apparatus including an encoder which performs coding using an error-correction coding method according to an embodiment of the present invention.

FIG. 1 is a block diagram illustrating the construction of a digital signal transmission apparatus including an encoder that performs coding using an error-correction coding method according to the embodiment of the invention. In FIG. 1, reference numeral 101 denotes the digital signal transmission apparatus. Numeral 102 denotes an 8-10 conversion means for converting every 8 bits of an input video signal into a 10-bit signal. Numeral 103 denotes an encoder for converting an input audio signal into a coded audio signal to which an error correction code is added. Numeral 104 denotes a 2-10 conversion means for converting every 2 bits of the coded audio signal outputted from the encoder 103 into a 10-bit signal. Numeral 105 denotes a signal multiplexing transmission means for multiplexing the output of the 8-10 conversion means 102 and the output of the 2-10 conversion means, and transmitting the multiplexed signal.

Figure 2:
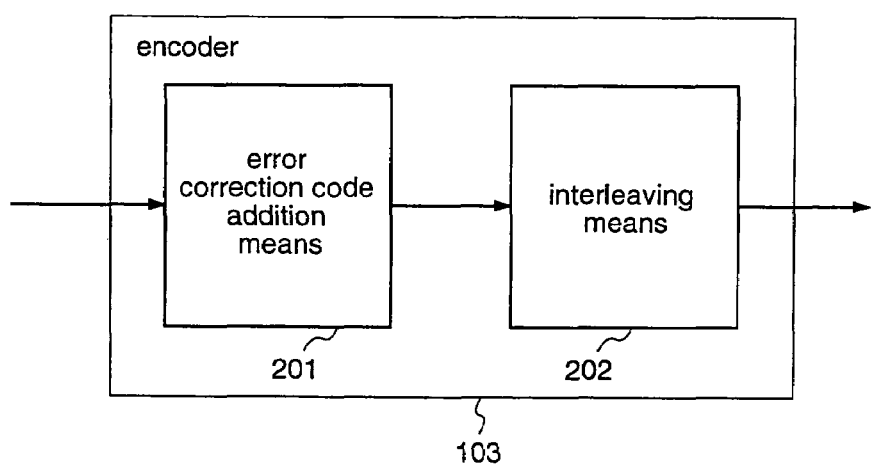
FIG. 2 is a block diagram illustrating the construction of the encoder which performs coding using the error-correction coding method according to the embodiment of the present invention.

FIG. 2 is a block diagram illustrating the construction of the encoder 103 included in the digital signal transmission apparatus 101 shown in FIG. 1. In FIG. 2, reference numeral 201 denotes an error correction code addition means for adding an error correction code to each of samples (sample data units) of the input audio signal, and numeral 202 denotes an interleaving means for alternately outputting the n-th sample (sample data unit) and the (n+1)th sample (sample data unit), bit by bit, which samples (sample data units) have been given the error correction codes by the error correction code addition means 201.

Figure 3:
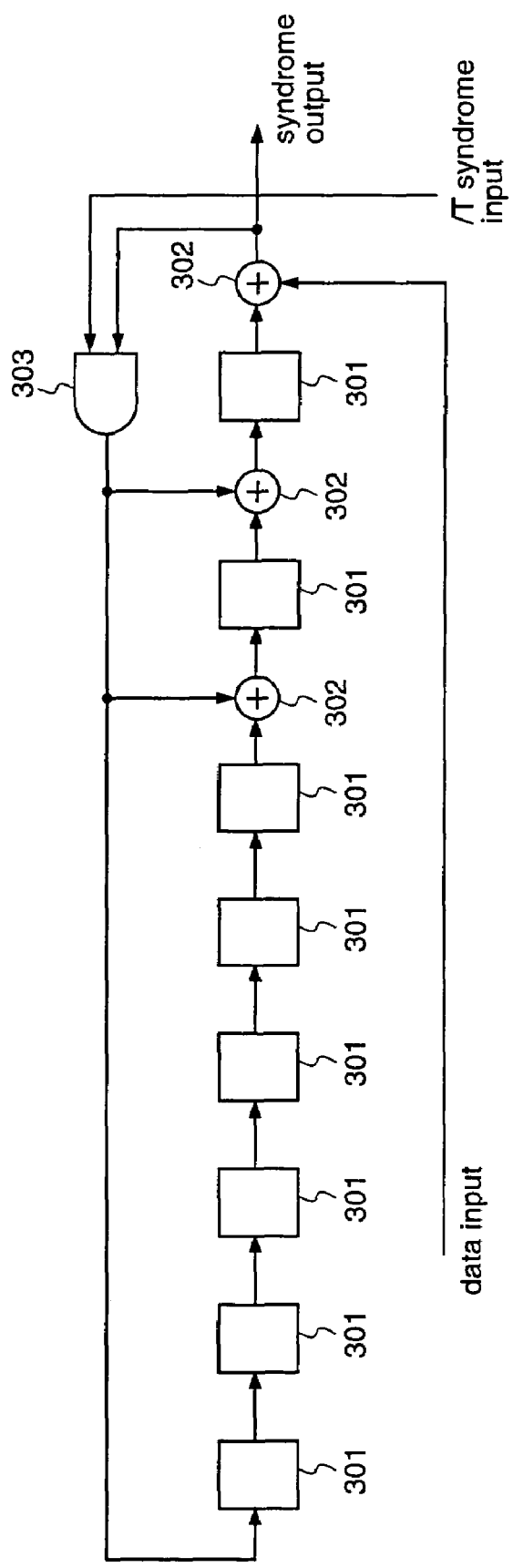
FIG. 3 is a diagram illustrating an example of construction of an error correction code addition means included in the encoder which performs coding using the error-correction coding method according to the embodiment of the present invention.
Figure 4A:
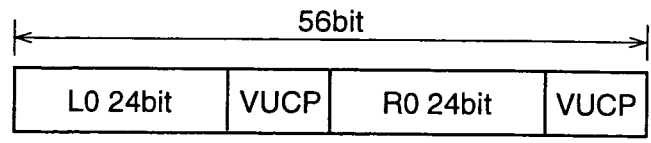
FIG. 4(*a*) is a diagram illustrating samples (sample data units) of an audio signal to be input to the error correction code addition means.
Figure 4A:
Figure 4B:
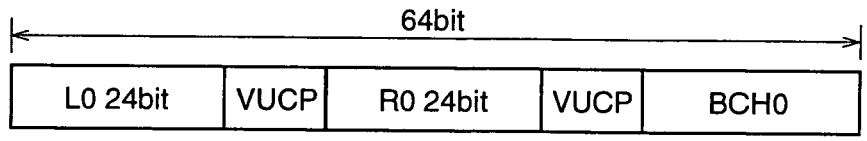
Figure 4B:
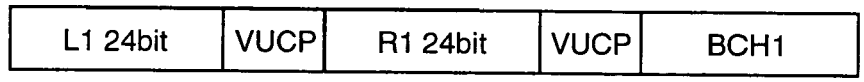

FIG. 3 is a diagram illustrating an example of construction of the error correction code addition means 201 included in the encoder 103 shown in FIG. 2. In FIG. 3, reference numeral 301 denotes a delay means for delaying an input signal by one clock, numeral 302 denotes an exclusive OR means, and 303 denotes an AND means.

Next, the operation at transmission will be described. In FIG. 1, a digital video signal and a digital audio signal which are output from a signal source such as a DVD player are input to the digital signal transmission apparatus 101. Between the inputted digital video signal and digital audio signal, the digital video signal is converted for every 8 bits into a 10-bit signal by the 8-10 conversion means 102 (8-10 conversion). On the other hand, the digital audio signal inputted to the digital signal transmission apparatus 101 is input to the encoder 103.

FIG. 4(*a*) is a diagram illustrating samples (sample data units) of an audio signal to be input to the error correction code addition means 201 of the encoder 103. In FIG. 4(*a*), the upper stage shows a signal of sample (sample data unit) 0 including L channel data and R channel data of L0 and R0, respectively, and the lower stage shows a signal of sample (sample data unit) 1 including L channel data and R channel data of L1 and R1, respectively. Each sample (sample data unit) (e.g., sample (sample data unit) 0 and sample (sample data unit) 1) is a 56-bit signal in which a 4-bit VUCP signal is added to each of the 24-bit L channel data and the 24-bit R channel data. The 56-bit audio signals shown in FIG. 4(*a*) are time-sequentially input to the error correction code addition means 201 in order of sample (sample data unit) 0→sample (sample data unit) 1 sample (sample data unit) 2 (not shown)→ . . . . In this embodiment, a cyclic code polynomial, $G(x)=1+x6+x7+x8$, is realized by the circuit structure including the 8 stages of delay means as shown in FIG. 3, and an 8-bit error correction code is generated and added to each sample (sample data unit). That is, in FIG. 3, the 56-bit audio signals are sequentially input as a data input under the state where a /T syndrome input is 1, and the /T syndrome input is made 0 at the timing when all of the 56 bits have been inputted, and an 8-bit signal outputted as a syndrome output when 8-bit shift operation is made under this state is added as an error correction code. Thereby, as shown in FIG. 4(*b*), the sample (sample data unit) 0 is given an error correction code BCH0 while the sample (sample data unit) 1 is given an error correction code BCH1, and these samples (sample data units) are sequentially output from the error correction code addition means 201. The interleaving means 202 temporarily holds the two continuous samples (sample data units) of the audio signal to which the error correction codes are added by the error correction code addition means 201, and takes out every one bit from these two samples (sample data units) alternately. Taking the samples (sample data units) shown in FIG. 4(*b*) as an example, the interleaving means 202 temporarily holds the audio signals with the error correction codes, which are supplied from the error correction code addition means 201 in order of sample (sample data unit) 0, sample 1, and every one bit is taken out of the two samples (sample data units) alternately, in order of the 1st bit of sample (sample data unit) 0, the 1st bit of sample (sample data unit) 1, the 2nd bit of sample (sample data unit) 0, the 2nd bit of sample (sample data unit) 1, . . . , the 64th bit of sample (sample data unit) 0, and the 64th bit of sample (sample data unit) 1.

The coded audio signal interleaved by the interleaving means 202 (the audio signal to which the error correction code is added) is converted for every two continuous bits into a 10-bit signal by the 2-10 conversion means 104 (2-10 conversion).

The signal multiplexing transmission means 105 multiplexes the video signal that is 8-10 converted by the 8-10 conversion means and the coded audio signal that is 2-10 converted by the 2-10 conversion means 104, and transmits the multiplexed signal.

Figure 5:
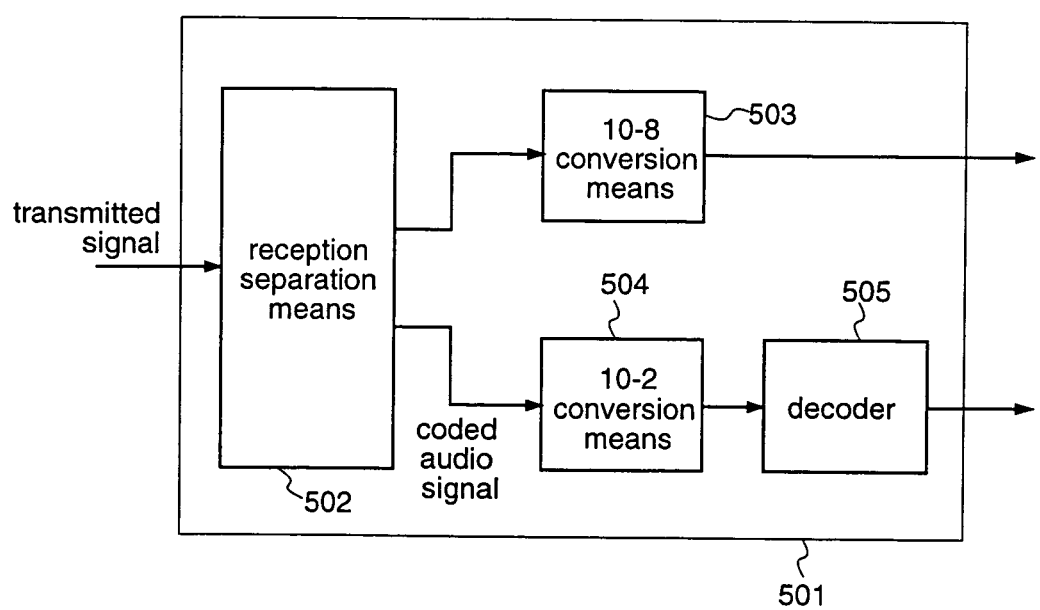
FIG. 5 is a block diagram illustrating the construction of a digital signal reception apparatus including a decoder which performs decoding using an error-correction decoding method according to the embodiment of the present invention.

FIG. 5 is a block diagram illustrating the construction of a digital signal reception apparatus including a decoder for performing decoding using an error correction decoding method of the present invention. In FIG. 5, reference numeral 501 denotes the digital signal reception apparatus. Numeral 502 denotes a reception demultiplexing means for receiving the multiplexed signal transmitted from the digital signal transmission apparatus 101, and demultiplexing the signal into the 8-10 converted video signal and the 2-10 converted coded audio signal to output these signals. Numeral 503 denotes a 10-8 conversion means for converting every 10 bits of the 8-10 converted video signal into the original 8-bit signal. Numeral 504 denotes a 10-2 conversion means for converting every 10 bits of the 2-10 converted coded audio signal into the original 2-bit signal. Numeral 505 denotes a decoder for detecting and correcting a transmission error in the coded audio signal that has been 10-2 converted by the 10-2 conversion means 504.

Figure 6:
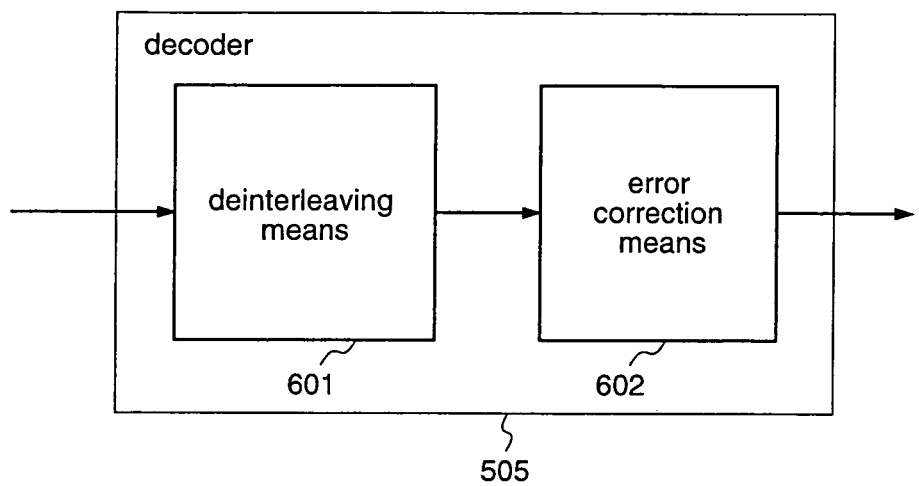
FIG. 6 is a block diagram illustrating the construction of the decoder which perform decoding using the error-correction decoding method according to the embodiment of the present invention.

FIG. 6 is a block diagram illustrating the construction of the decoder 505 included in the digital signal reception apparatus 501 shown in FIG. 5. In FIG. 6, reference numeral 601 denotes a deinterleaving means for deinterleaving a sequence of continuous bits of the inputted coded audio signal, bit by bit, into two samples (sample data units). Numeral 602 denotes an error correction means for detecting whether a transmission error exists or not by processing each sample (sample data unit) of the coded audio signal obtained by deinterleaving by the deinterleaving means 601, and correcting a detected error.

Next, the operation at reception will be described. The reception demultiplexing means 502 receives the multiplexed signal transmitted from the digital signal transmission apparatus 101, demultiplexes the signal into the 8-10 converted video signal and the 2-10 converted coded audio signal, and outputs the 8-10 converted video signal and the 2-10 converted coded audio signal to the 10-8 conversion means 503 and the 10-2 conversion means 504, respectively. The 10-8 conversion means 503 converts every 10 bits of the inputted 8-10 converted video signal into the original 8-bit signal, and outputs the signal to a signal processing means (not shown) in the subsequent stage, such as a digital-to-analog converter. Further, the 10-2 conversion means 504 converts every 10 bits of the inputted 2-10 converted coded audio signal into the original 2-bit signal, and outputs the signal to the decoder 505. The deinterleaving means 601 in the decoder 505 deinterleaves the sequence of continuous bits of the coded audio signal outputted from the 10-2 conversion means 504, bit by bit, into two samples (sample data units), and sequentially outputs these samples (sample data units) to the error correction means 602. The error correction means 602 is provided with a cyclic polynomial circuit having the same structure as that shown in FIG. 3, and the samples (sample data units) of the deinterleaved coded audio signal are successively inputted from a data input terminal of the cyclic polynomial circuit. When a 64-bit sample (data sample unit) to which an error correction code is added is passed through the cyclic polynomial circuit, all of the last 8 bits of the syndrome output become 0 when there is no transmission error. The error correction means 602 judges that no transmission error occurs when all of the last 8 bits of the syndrome output are 0, and outputs a digital audio signal obtained by removing the error correction code from the inputted coded audio signal, to a subsequent signal processing means such as a digital analog converter (not shown). On the other hand, when all of the last 8 bits of the syndrome output are not 0, it is judged that there is a transmission error, and the error bit is specified by the following procedure, and then the specified error bit is inverted to correct the error and, thereafter, the digital audio signal from which the error correction code is removed is outputted to the subsequent signal processing means such as a digital analog converter. In the cyclic polynomial circuit shown in FIG. 3, when there is only one error bit in the inputted sample (sample data unit), 0 is continuously inputted from the data input, following the sample (sample data unit). If there is an error in the n-th bit of the sample (sample data unit), a bit string of a specific pattern appears in the syndrome output at the point in time when n bits of 0 are inputted, and thereby it is judged that an error occurs in the n-th bit of the sample (sample data unit).

Figure 7:
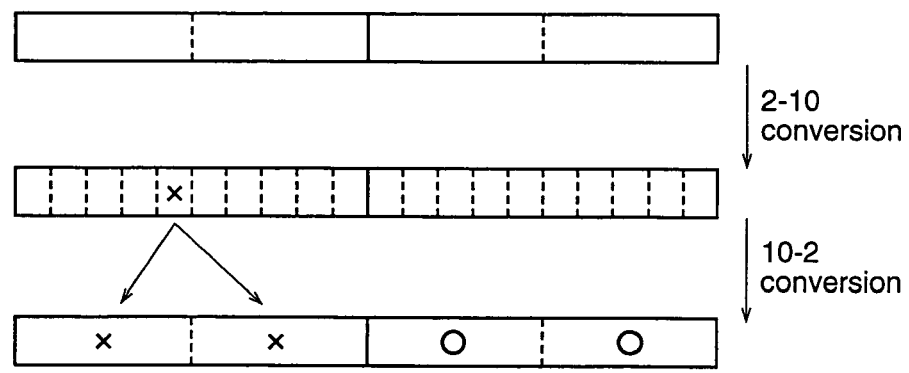
FIG. 7 is a diagram for explaining the state where a bit error which has occurred in a transmission path when transmitting a digital signal using 2-10 conversion and 10-2 conversion, propagates into a signal after 10-2 conversion.

In a digital signal transmission path having generally required performance, occurrence of plural bit errors in a short period is rare. However, like the standard of an interface for digital display connection that is defined by the DDWG (Digital Display Working Group), when employing a transmission method in which 2-10 conversion for a digital audio signal is performed at the transmitting end to output the signal to the transmission path, and 10-2 conversion is performed at the receiving end to obtain the original digital audio signal, since 10 bits are converted into a 2-bit signal in the 10-2 conversion, if there is one bit error in the 10-bit signal as shown in FIG. 7, the 10-bit signal does not indicate a correct 2-bit signal to be obtained any more, and it is considered that both of the 2 bits of the 2-bit signal after the 10-2 conversion might have wrong values. That is, one bit error that occurs during transmission might cause two continuous bit errors at the receiving end. Particularly in the standard of the interface for digital display connection that is defined by the DDWG (Digital Display Working Group), among the four kinds of 10-bit signals used for 2-10 conversion, there are 10-bit signals having a Hamming distance of 1, that is, 10-bit signals corresponding to different 2-bit signals, having only one bit as the number of portions having different bit patterns, and therefore, there is a high possibility that, when an error occurs, a 10-bit signal corresponding to a certain 2-bit signal might be changed to a 10-bit signal corresponding to another 2-bit signal. In this case, even when the signal including the two continuous bit errors is input to the cyclic polynomial circuit as shown in FIG. 3 to perform error detection, the error positions cannot be specified although it is judged that the signal includes the errors, and therefore, error correction cannot be carried out.

In the error-correction coding method and the error-correction decoding method according to the embodiment of the invention, at the transmitting end, interleaving is carried out after addition of error correction codes and then the interleaved signal is subjected to 2-10 conversion and transmitted, and at the receiving end, the 10-2 converted signal is deinterleaved and thereafter error detection and error correction are carried out. That is, the signal including two continuous bit errors as shown in the lowermost stage in FIG. 7 is subjected to error detection and error correction after being deinterleaved into two samples (sample data units) each including only one bit error. Thereby, the error positions can be specified by the cyclic polynomial circuit as shown in FIG. 3, and error correction can be carried out.

By the way, when employing the above-mentioned transmission method in which 2-10 conversion for a digital audio signal is carried out at the transmitting end to output the signal to the transmission path, and 10-2 conversion is carried out at the receiving end to obtain the original digital audio signal, if there is one bit error in the 10-bit signal, the 2-bit signal after the 10-2 conversion might become (0,0) although it has originally been (1,1), that is, both of the two bits might have wrong values. However, the 2-bit signal after the 10-2 conversion might become (0,1) or (1,0) which has originally been (1,1), that is, only one bit between the two continuous bits might have a wrong value. In the case where only one bit between the two continuous bits has a wrong value, when the 10-2 converted signal is deinterleaved as in this embodiment, only one sample (sample data unit) includes an error while the other sample (sample data unit) includes no errors. It is now assumed that two transmission errors occur during transmission in a section to be two samples (sample data units) of the coded audio signal after the 10-2 conversion. When one of such two transmission errors is an error by which both of the two bits of the 2-bit signal after the 10-2 conversion take wrong values as in the case where the 2-bit signal which has originally been (1,1) becomes (0,0) while the other transmission error is an error by which only one bit of the two continuous bits takes a wrong value as in the case where the 2-bit signal which has originally been (1,1) becomes (0,1) or (1,0), when the 10-2 converted signal is deinterleaved, one sample (sample data unit) includes two errors while the other sample (sample data unit) includes only one error. Accordingly, as for the sample (sample data unit) including two errors, the error positions cannot be specified, and therefore, error correction cannot be carried out. However, as for the other sample (sample data unit) including only one error, the error position can be specified, and thereby error correction can be carried out. Since it is estimated that the sample (sample data unit) including two errors has an error in the same position as in the sample (sample data unit) including one error, one of the errors included in the sample (sample data unit) having two errors can be corrected using the result of error correction for the sample (sample data unit) including one error. As a result, the sample (sample data unit) which has included two errors becomes a sample (sample data unit) including only one error, and this sample (sample data unit) is again input to the cyclic polynomial circuit as shown in FIG. 3 to perform error detection, whereby the position of the remaining error can be specified, and all of the errors can be corrected.

Figure 13:
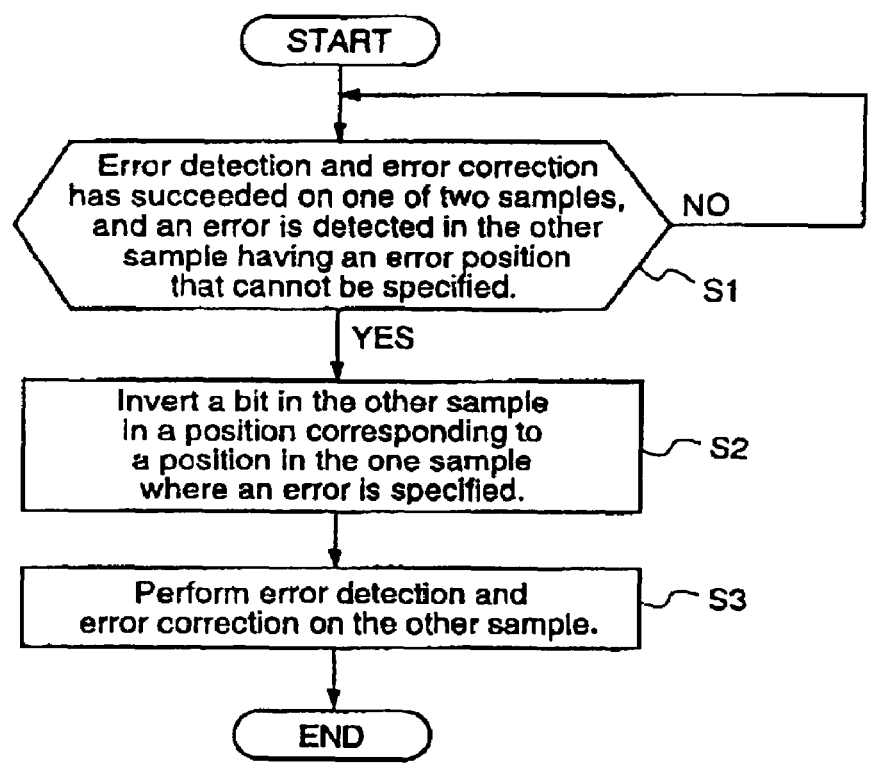
FIG. 13 is a diagram for explaining error detection and error correction for an embodiment of the present invention.

Accordingly, in this embodiment of the invention as illustrated in FIG. 13, in the case where the error correction means 602 performs error detection and error correction for each of two continuous samples (sample data units) of the digital audio signal, when an error is detected in one sample (sample data unit), but the error position cannot be specified, while the other sample (sample data unit) has had its error detected and corrected (S1), a bit in a position in the one sample (sample data unit) corresponding to the error position specified in the other sample (sample data unit) for which error detection and error correction have been performed, is inverted (S2) and, thereafter, the sample (sample data unit) with the inverted bit is again subjected to error detection and error correction (S3), whereby the error correction rate can be increased.

As described above, according to the embodiment of the invention, when transmitting a digital video signal and a digital audio signal through a digital interface means between the transmitting end and the receiving end, at the transmitting end, after an error correction code is added to each of samples (sample data units) of the digital audio signal, two continuous samples (sample data units) of the digital audio signal to which the error correction codes are added are interleaved to generate a coded audio signal to be transmitted; and at the receiving end, the sequence of continuous bits of the received coded audio signal is deinterleaved bit by bit into two samples (sample data units) of digital audio signals and, thereafter, error detection and error correction are carried out for each sample (sample data unit) of the digital audio signal obtained by the deinterleaving. Therefore, when a video signal and an audio signal are multiplexed and transmitted through a DVI, error detection and error correction for the audio signal can be effectively carried out.

In the above-described embodiment, 2-10 conversion for converting every two bits of a coded digital audio signal into a 10-bit signal is carried out at the transmitting end to output the signal to the transmitting path and then 10-2 conversion is carried out at the receiving end to obtain the original coded digital audio signal. However, multiple-bit conversion at signal transmission is not restricted to 2-10 conversion. When applying the present invention to a method employing n-m conversion as a multiple-bit conversion, n continuous pieces of samples (sample data units) of a digital audio signal to which error correction codes are added are interleaved to generate a coded audio signal, and a sequence of continuous bits of the coded audio signal is deinterleaved bit by bit into n pieces of samples (sample data units) of the digital audio signal, whereby the same effects as described for the embodiment can be achieved.

Hereinafter, a description will be given of a modification in which the present invention is applied to a system where 4-10 conversion for converting every four bits of a coded digital audio signal into a 10-bit signal at the transmitting end to output the signal to the transmission path, and 10-4 conversion is carried out at the receiving end to obtain the original coded digital audio signal at the receiving end.

Figure 8:
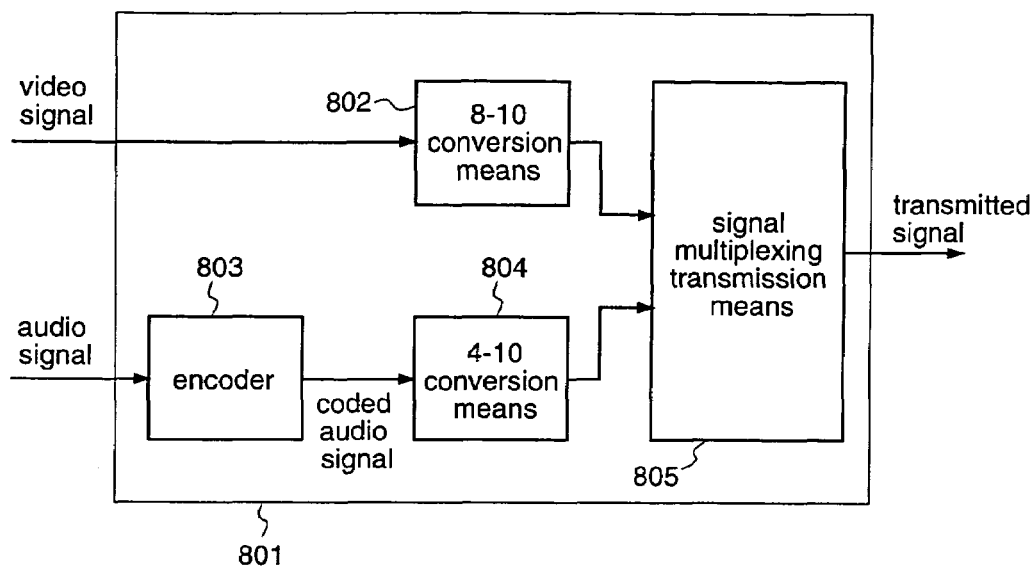
FIG. 8 is a block diagram illustrating the construction of a digital signal transmission apparatus according to a modification of the embodiment of the present invention.

FIG. 8 is a block diagram illustrating the construction of a digital signal transmission apparatus according to the modification. In FIG. 8, reference numeral 801 denotes a digital signal transmission apparatus. Reference numeral 802 denotes an 8-10 conversion means for converting every 8 bits of an inputted video signal into a 10-bit signal. Reference numeral 803 denotes an encoder for converting an inputted audio signal into a coded audio signal to which an error correction code is added. Reference numeral 804 denotes a 4-10 conversion means for converting every four bits of the coded audio signal outputted from the encoder 803 into a 10-bit signal. Reference numeral 805 denotes a signal multiplexing transmission means for multiplexing the output of the 8-10 conversion means 802 and the output of the 4-10 conversion means 804 to output the multiplexed signal.

Figure 9:
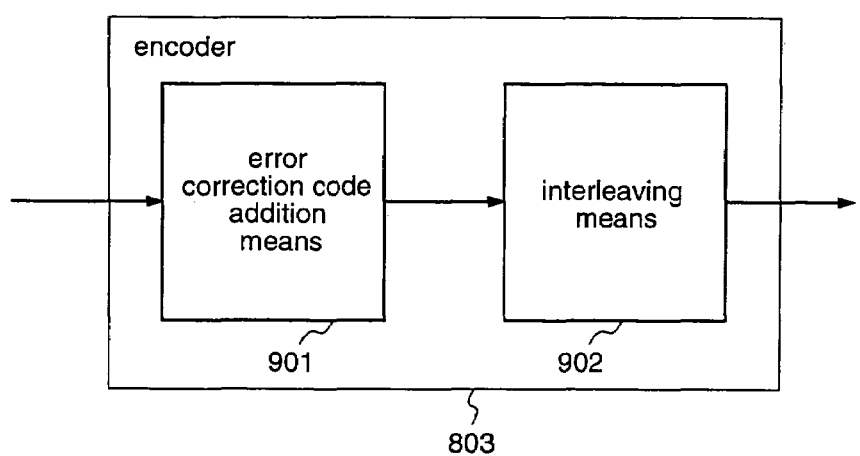
FIG. 9 is a block diagram illustrating the construction of an encoder 803 included in a digital signal transmission apparatus 801 shown in FIG. 8.

FIG. 9 is a block diagram illustrating the construction of the encoder 803 included in the digital signal transmission apparatus 801 shown in FIG. 8. In FIG. 9, reference numeral 901 denotes an error correction code addition means for adding an error correction code to each of samples (sample data units) of an inputted audio signal, and numeral 902 denotes an interleaving means for cyclically outputting, bit by bit, the n-th sample (sample data unit), the (n+1)th sample (sample data unit), the (n+2)th sample (sample data unit), and the (n+3)th sample (sample data unit), which samples (sample data units) are given error correction codes by the error correction code addition means 901.

The error correction code addition means 901 included in the encoder 803 has the structure shown in FIG. 3 like the error correction code addition means 201 included in the encoder 103 shown in FIGS. 1 and 2.

Initially, the operation at transmission will be described. In FIG. 8, a digital video signal and a digital audio signal outputted from a signal source such as a DVD player or the like are input to the digital signal transmission apparatus 801. Between the inputted digital video signal and digital audio signal, every eight bits of the digital video signal are converted into a 10-bit signal by the 8-10 conversion means 802 (8-10 conversion). On the other hand, the digital audio signal inputted to the digital signal transmission apparatus 801 is inputted to the encoder 803.

In the error correction code addition means 901, a 56-bit audio signal as shown in FIG. 4(*a*) is time-sequentially inputted in order of sample (sample data unit) 0→sample (sample data unit) 1→sample (sample data unit) 2 (not shown)→sample (sample data unit) 3 (not shown)→ . . . . In this embodiment, a cyclic code polynomial, $G(x)=1+x6+x7+x8$, is realized by the circuit structure including the 8 stages of delay means as shown in FIG. 3, and an 8-bit error correction code is generated and added to each sample (sample data unit). That is, in FIG. 3, the 56-bit audio signal is sequentially inputted from the data input under the state where the /T syndrome input is 1, and the /T syndrome input is made 0 at the timing when all of the 56 bits have been inputted, and an 8-bit signal which is outputted as a syndrome output when 8-bit shift operation is made under this state is added as an error correction code. Thereby, as shown in FIG. 4(*b*), an error correction code BCH0 is added to the sample (sample data unit) 0 while an error correction code BCH1 is added to the sample (sample data unit) 1, and these samples (sample data units) are sequentially output from the error correction code addition means 901. The interleaving means 902 temporarily holds the continuous four samples (sample data units) of the audio signal to which the error correction codes are added by the error correction code addition means 201, and cyclically takes out each bit from the four samples (sample data units). Taking the sample (sample data unit) shown in FIG. 4(*b*) as an example, the interleaving means 902 temporarily holds the samples (sample data units) of the audio signal to which error correction codes are added, which are supplied from the error correction code addition means 901 in order of sample (sample data unit) 0, sample (sample data unit) 1, sample (sample data unit) 2, and sample (sample data unit) 3, and cyclically takes out each bit from the four samples (sample data units) in order of the 1st bit of sample (sample data unit) 0, the 1st bit of sample (sample data unit) 1, the 1st bit of sample (sample data unit) 2, the 1st bit of sample (sample data unit) 3, the 2nd bit of sample (sample data unit) 0, the 2nd bit of sample (sample data unit) 1, the 2nd bit of sample (sample data unit) 2, the 2nd bit of sample (sample data unit) 3, . . . , the 64th bit of sample (sample data unit) 0, the 64th bit of sample (sample data unit) 1, the 64th bit of sample (sample data unit) 2, the 64th bit of sample (sample data unit) 3.

The coded audio signal which has been interleaved by the interleaving means 902 (the audio signal to which the error correction codes are added) is converted for every 4 continuous bits into a 10-bit signal by the 4-10 conversion means 804 (4-10 conversion).

The signal multiplexing transmission means 805 multiplexes the video signal that has been 8-10 converted by the 8-10 conversion means 802 and the coded audio signal that has been 4-10 converted by the 4-10 conversion means 804, and transmits the multiplexed signal.

Figure 10:
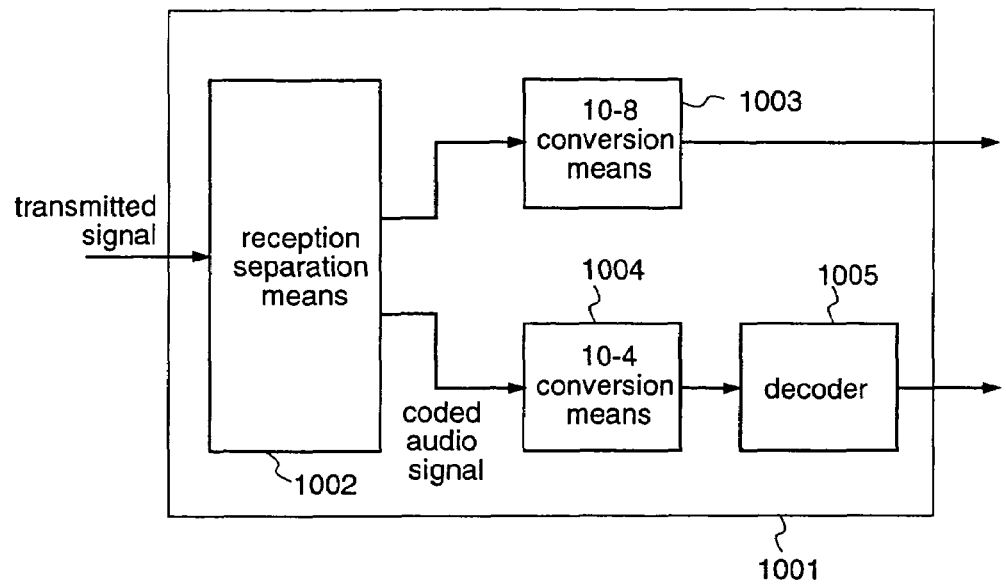
FIG. 10 is a block diagram illustrating the construction of a digital signal reception apparatus according to the modification of the embodiment of the present invention.

FIG. 10 is a block diagram illustrating the construction of a digital signal reception apparatus according to the modification. In FIG. 10, reference numeral 1001 denotes a digital signal reception apparatus. Reference numeral 1002 denotes a reception separation means for receiving the multiplexed signal transmitted from the digital signal transmission apparatus, and separates the signal into the 8-10 converted video signal and the 4-10 converted coded audio signal to output these signals. Reference numeral 1003 denotes a 10-8 conversion means for converting every 10 bits of the inputted 8-10 converted video signal into the original 8-bit signal. Reference numeral 1004 denotes a 10-4 conversion means for converting every 10 bits of the inputted 4-10-converted coded audio signal into the original 4-bit signal. Reference numeral 1005 denotes a decoder for detecting and correcting a transmission error in the coded audio signal which has been 10-4 converted by the 10-4 conversion means 1004.

Figure 11:
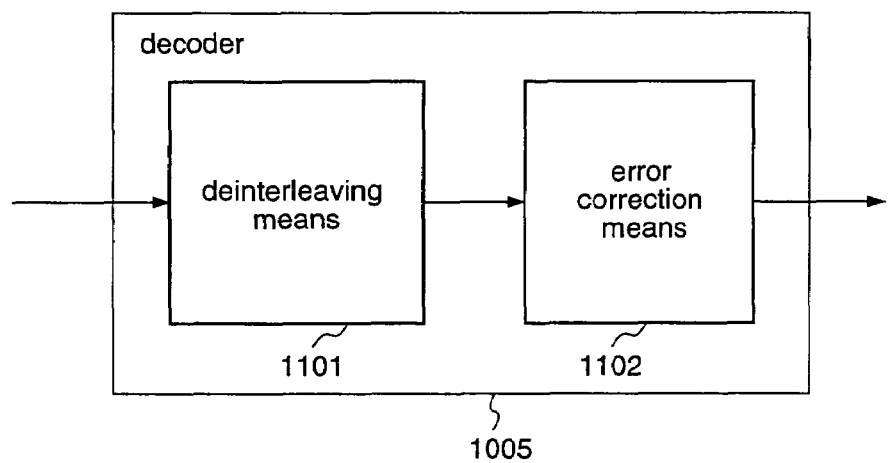
FIG. 11 is a block diagram illustrating the construction of a decoder 1005 included in a digital signal reception apparatus 1001 shown in FIG. 10.

FIG. 11 is a block diagram illustrating the construction of the decoder 1005 included in the digital signal reception apparatus 1001 shown in FIG. 10. In FIG. 11, reference numeral 1101 denotes a deinterleaving means for deinterleaving a sequence of continuous bits of the inputted coded audio signal, bit by bit, into four samples (sample data unit). Reference numeral 1102 denotes an error correction means for processing each sample (sample data unit) of the coded audio signal obtained by deinterleaving by the deinterleaving means 1101, detecting whether there is a transmission error or not, and correcting a detected error.

Next, the operation at reception will be described. The reception separation means 1002 receives the multiplexed signal transmitted from the digital signal transmission apparatus 801, separates the signal into the 8-10 converted video signal and the 4-10 converted coded audio signal, and outputs the 8-10 converted video signal and the 4-10 converted coded audio signal to the 10-8 conversion means 1003 and the 10-4 conversion means 1004, respectively. The 10-8 conversion means 1003 converts every 10 bits of the inputted 8-10-converterd video signal into the original 8-bit signal, and outputs the signal to the subsequent signal processing means (not shown) such as a digital analog converter. Further, the 10-4 conversion means 1004 converts the every 10 bits of the inputted 4-10-converted coded audio signal into the original 4-bit signal, and outputs the signal to the decoder 1005. The deinterleaving means 1101 included in the decoder 1005 deinterleaves the sequence of continuous bits of the coded audio signal that is outputted from the 10-4 conversion means 1004, bit by bit, into four samples (sample data units), and successively outputs the respective samples (sample data units) to the error correction means 1102. The error correction means 1102 is provided with a cyclic polynomial circuit having the same structure as that shown in FIG. 3, and the deinterleaved samples (sample data units) of the coded audio signal are successively inputted from the data input of the cyclic polynomial circuit. When a 64-bit sample (sample data unit) to which an error correction code is added is passed through the cyclic polynomial circuit, all of the last 8 bits of the syndrome output become 0 when there is no transmission error. When all of the last 8 bits of the syndrome output are 0, the error detection means 1102 judges that there is no transmission error, and outputs the digital audio signal obtained by removing the error correction code from the inputted coded audio signal, to the subsequent signal processing means (not shown) such as a digital analog converter. On the other hand, when all of the last 8 bits of the syndrome output are not 0, the error detection means 1102 judges that there is a transmission error, and specifies an error bit in the following procedure, and inverts the specified error bit to perform error correction and, thereafter, outputs the digital audio signal from which the error correction code is removed to the subsequent signal processing means (not shown) such as a digital analog converter. In the cyclic polynomial circuit as shown in FIG. 3, when there is only one error bit in the inputted sample (sample data unit), 0 is continuously inputted from the data input, following the sample (sample data unit). When the n-th bit is an error bit in the sample (sample data unit), a bit string of a specific pattern appears in the syndrome output at the point in time when n bits of 0 have been inputted, and thereby it is judged that there is an error at the n-th bit in the sample (sample data unit).

Figure 12:
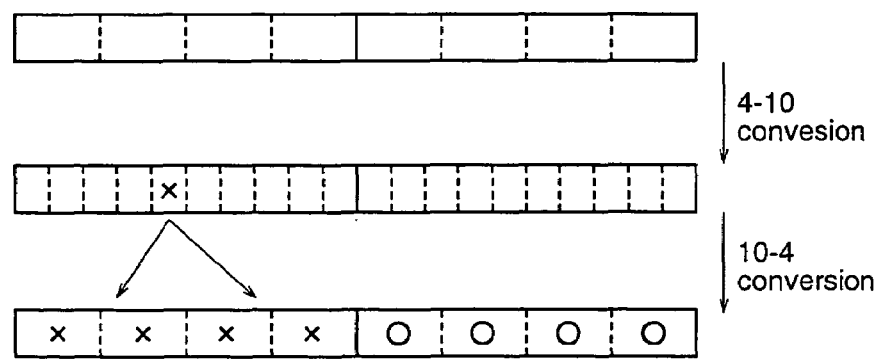
FIG. 12 is a diagram for explaining the state where a bit error which has occurred in a transmission path when transmitting a digital signal using 4-10 conversion and 10-4 conversion, propagates into a signal after 10-4 conversion.

In a digital signal transmission path having generally required performance, occurrence of plural bit errors in a short period is rare. However, like the standard of an interface for digital display connection that is defined by the DDWG (Digital Display Working Group), when employing a transmission method in which 4-10 conversion for a digital audio signal is performed at the transmitting end to output the signal to the transmission path, and 10-4 conversion is performed at the receiving end to obtain the original digital audio signal, since 10 bits are converted into one 4-bit signal in the 10-4 conversion, if there is one error bit in the 10-bit signal as shown in FIG. 12, the 10-bit signal does not indicate a correct 4-bit signal to be obtained by the 10-4 conversion any more, and it is considered that all of the 4 bits of the 4-bit signal after the 10-4 conversion might take wrong values. That is, only one bit error that occurs during transmission causes continuous four bit errors at the receiving end. In this case, even when the signal including the continuous four bit errors is inputted to the cyclic polynomial circuit as shown in FIG. 3 to perform error detection, the error positions cannot be specified although it is judged that the signal includes the errors, and therefore, error correction cannot be carried out.

In the error-correction coding method and the error-correction decoding method according to the modification, at the transmitting end, interleaving is carried out after addition of error correction codes and then the interleaved signal is subjected to 4-10 conversion and transmitted; and at the receiving end, the 10-4 converted signal is deinterleaved and thereafter error detection and error correction are carried out. That is, the signal including four continuous bit errors as shown in the lowermost stage in FIG. 12 is subjected to error detection and error correction after being deinterleaved into four samples (sample data units) each including only one bit error. Thereby, the error positions can be specified by the cyclic polynomial circuit as shown in FIG. 3, and error correction can be carried out.

By the way, when employing the above-mentioned transmission method in which 4-10 conversion for a digital audio signal is carried out at the transmitting end to output the signal to the transmission path, and 10-4 conversion is carried out at the receiving end to obtain the original digital audio signal, if there is one bit error in the 10-bit signal, the 4-bit signal after the 10-4 conversion might become (0,0,0, 0) although it has originally been (1,1,1,1), that is, all of the four bits might take wrong values. However, the 4-bit signal after the 10-4 conversion might become (0,1,1,1) or (1,0,1,1) which has originally been (1,1,1,1), that is, only one bit among the four continuous bits might take a wrong value. In the case where only one bit among the continuous four bits takes a wrong value, when the 10-4 converted signal is deinterleaved as in this modification, only one sample (sample data unit) includes an error while the other samples (sample data units) include no errors. It is now assumed that two transmission errors occur during transmission in a section to be four samples (sample data units) of the coded audio signal after the 10-4 conversion. In the case where one of such two transmission errors is an error by which all of the four bits of the 4-bit signal after the 10-4 conversion take wrong values as in the case where the 4-bit signal which has originally been (1,1,1,1) becomes (0,0,0,0) while the other transmission error is an error by which only one bit among the four continuous bits takes a wrong value as in the case where the 4-bit signal which has originally been (1,1,1,1) becomes (0,1,1,1) or (1,0,1,1), when the 10-4 converted signal is deinterleaved, one sample (sample data unit) includes two errors while the other samples (sample data units) include only one error. Accordingly, as for the sample (sample data unit) including two errors, the error positions cannot be specified, and therefore, error correction cannot be carried out. However, as for the other samples (sample data units) each including only one error, the error position can be specified, and thereby error correction can be carried out. Since it is estimated that the sample (sample data unit) including two errors has an error in the same position as in the sample (sample data unit) including one error, one of the errors included in the sample (sample data unit) having two errors can be corrected using the result of error correction for the sample (sample data unit) including one error. As a result, the sample (sample data unit) which has included two errors becomes a sample (sample data unit) including only one error, and this sample (sample data unit) is again input to the cyclic polynomial circuit as shown in FIG. 3 to perform error detection, whereby the position of the remaining error can be specified, and all of the errors can be corrected.

Figure 14:
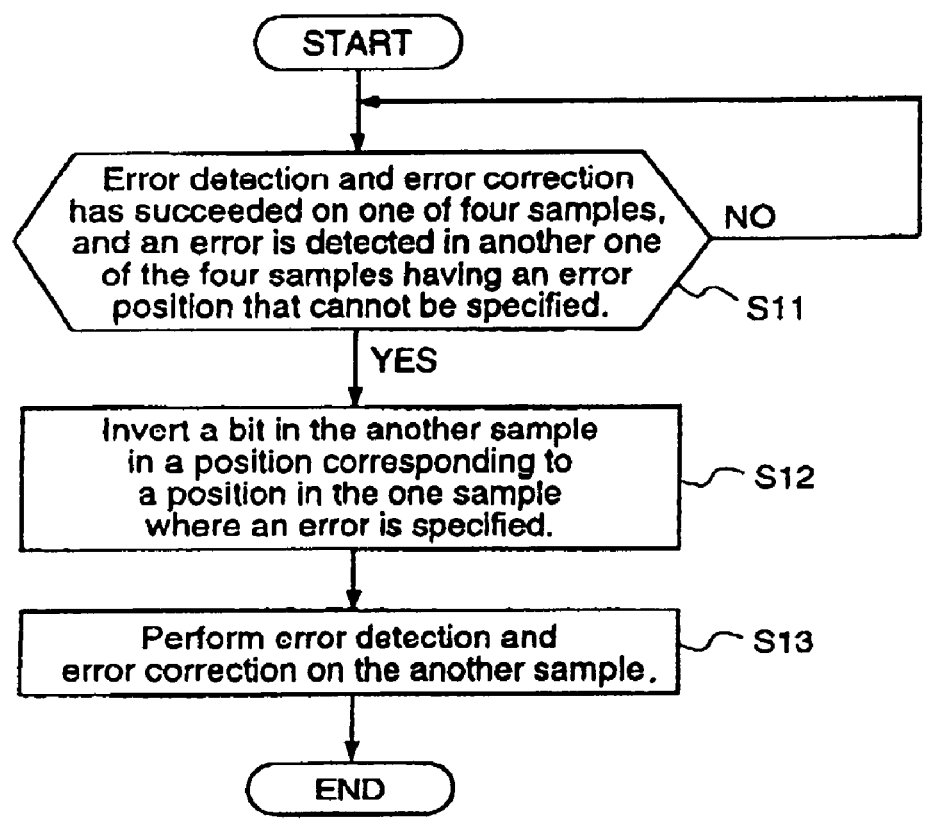
FIG. 14 is a diagram for explaining error detection and error correction for another embodiment of the invention.

Accordingly, in this modification as illustrated in FIG. 14, in the case where the error correction means 1102 performs error detection and error correction for each of four continuous samples (sample data units) of a digital audio signal, when an error is detected in one sample (sample data unit), but the error position cannot be specified, while the other samples (sample data units) have succeeded in error detection and error correction (S11), a bit in a position of the one sample (sample data unit) corresponding to the error position specified in the other samples (sample data units) for which error detection and error correction have succeeded, is inverted (S12) and, thereafter, the sample (sample data unit) with the inverted bit is again subjected to error detection and error correction (S13), whereby the error correcting rate can be increased.

As described above, according to the modification, when transmitting a digital video signal and a digital audio signal through a digital interface means between the transmitting end and the receiving end, at the transmitting end, after an error correction code is added to each of samples (sample data units) of the digital audio signal, four continuous samples (sample data units) of the digital audio signals to which the error correction codes are added are interleaved to generate a coded audio signal to be transmitted; and at the receiving end, the sequence of continuous bits of the received coded audio signal is deinterleaved bit by bit into four samples (sample data units) of the digital audio signal and, thereafter, each sample of the deinterleaved digital audio signal is subjected to error detection and error correction. Therefore, when a video signal and an audio signal are multiplexed and transmitted by a DVI, error detection and error correction for the audio signal can be effectively carried out.

APPLICABILITY IN INDUSTRY

The present invention provides an error-correction coding method, an error-correction coding apparatus, a error-correction decoding method, and an error-correction decoding apparatus, which realize efficient error detection and error correction for an audio signal when a video signal and the audio signal are multiplexed and transmitted by, for example, a DVI (Digital Visual Interface).

The invention claimed is:

1. An error-correction coding method for performing coding in which error correction codes for correcting a transmission error at a receiving end are added to a digital audio signal to be transmitted, when transmitting a digital video signal and the digital audio signal from a transmitting end to the receiving end, said error-correction coding method comprising:
   adding an error correction code to each sample data unit of the digital audio signal;
   interleaving two continuous sample data units of the digital audio signal, to which the error correction codes are respectively added in said adding operation, to generate a coded audio signal; and
   transmitting the coded audio signal to the receiving end, wherein
   said transmitting operation comprises converting every two continuous bits of the coded audio signal generated by said interleaving operation into a converted signal of ten continuous bits, and transmitting the at least one converted signal.

2. An error-correction coding method for performing coding in which error correction codes for correcting a transmission error at a receiving end are added to a digital audio signal to be transmitted, when transmitting a digital video signal and the digital audio signal from a transmitting end to the receiving end, said error-correction coding method comprising:
   adding an error correction code to each sample data unit of the digital audio signal;
   interleaving four continuous sample data units of the digital audio signal, to which the error correction codes are respectively added in said adding operation, to generate a coded audio signal; and
   transmitting the coded audio signal to the receiving end, wherein
   said transmitting operation comprises converting every four continuous bits of the coded audio signal generated by said interleaving operation into a converted signal of ten continuous bits, and transmitting the at least one converted signal.

3. An error-correction coding apparatus for performing coding in which error correction codes for correcting a transmission error at a receiving end are added to a digital audio signal to be transmitted, when transmitting a digital video signal and the digital audio signal from a transmitting end to the receiving end, said error-correction coding apparatus comprising:
   an error correction code addition means for adding an error correction code to each sample data unit of the digital audio signal;

an interleaving means for interleaving two continuous sample data units of the digital audio signal, to which the error correction codes are respectively added by said error correction code addition means, to generate a coded audio signal; and a transmission means for transmitting the coded audio signal to the receiving end, wherein said transmission means further comprises a conversion means for converting every two continuous bits of the coded audio signal generated by said interleaving means into a converted signal of ten continuous bits, and a sub-transmission means transmitting the at least one converted signal.

4. An error-correction coding apparatus for performing coding in which error correction codes for correcting a transmission error at a receiving end are added to a digital audio signal to be transmitted, when transmitting a digital video signal and the digital audio signal from a transmitting end to the receiving end, said error-correction coding apparatus comprising:

an error correction code addition means for adding an error correction code to each sample data unit of the digital audio signal;

an interleaving means for interleaving four continuous sample data units of the digital audio signal, to which the error correction codes are respectively added by said error correction code addition means, to generate a coded audio signal; and a transmission means for transmitting the coded audio signal to the receiving end, wherein said transmission means further comprises a conversion means for converting every four continuous bits of the coded audio signal generated by said interleaving means into a converted signal of ten continuous bits, and a sub-transmission means for transmitting the at least one converted signal.

5. An error-correction coding apparatus for performing coding in which error correction codes for correcting a transmission error at a receiving end are added to a digital audio signal to be transmitted, when transmitting a digital video signal and the digital audio signal from a transmitting end to the receiving end, said error-correction coding apparatus comprising:

an error correction code addition unit operable to add an error correction code to each data unit of the digital audio signal;

an interleaving unit operable to interleave four data units of the digital audio signal, to which the error correction codes are respectively added by said error correction code addition unit, to generate a coded audio signal; and a transmission unit operable to transmit the coded audio signal to the receiving end, wherein said transmission unit is operable to convert every four continuous bits of the coded audio signal generated by said interleaving unit into a converted signal of ten continuous bits, and transmit the at least one converted signal.

* * * * *